(12) United States Patent
Lee et al.

(10) Patent No.: US 7,122,757 B2
(45) Date of Patent: Oct. 17, 2006

(54) CONTACT SENSOR PACKAGE STRUCTURE

(75) Inventors: Shih-Chang Lee, Kaohsiung (TW); Cheng-Yin Lee, Tainan (TW); Yung-Li Lu, Linyuan Township, Kaohsiung County (TW); Ying-Tsai Yeh, Renwu Township, Kaohsiung County (TW); Pei-Chi Lin, Zihguan Township, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 220 days.

(21) Appl. No.: 10/868,496

(22) Filed: Jun. 14, 2004

(65) Prior Publication Data

US 2005/0274597 A1   Dec. 15, 2005

(51) Int. Cl.
*H03K 17/975* (2006.01)

(52) U.S. Cl. .............. 200/600; 200/512; 345/173; 428/408; 428/702

(58) Field of Classification Search .......... 200/600, 200/512–514; 345/173–174, 156; 428/408, 428/212, 215–217, 702–704
See application file for complete search history.

(56) References Cited

U.S. PATENT DOCUMENTS

| | | | |
|---|---|---|---|
| 5,239,152 A * | 8/1993 | Caldwell et al. | 200/600 |
| 5,610,380 A * | 3/1997 | Nicolaisen | 200/600 |
| 6,224,952 B1 * | 5/2001 | Itoh | 427/577 |
| 6,265,070 B1 * | 7/2001 | Itoh | 428/408 |
| 6,343,519 B1 * | 2/2002 | Callicott et al. | 73/865.7 |
| 6,380,497 B1 * | 4/2002 | Hashimoto et al. | 200/5 A |
| 6,639,163 B1 * | 10/2003 | Fukui et al. | 200/512 |

* cited by examiner

*Primary Examiner*—K. Lee
(74) *Attorney, Agent, or Firm*—J.C. Patents

(57) ABSTRACT

A contact sensor package has a substrate, a film, a sealant and a plurality of contact sensors disposed on the substrate. The contact sensors are disposed within the enclosed space defined by the substrate, the film and the sealant. The contact sensor package further has at least a ground conductive trace formed on the substrate and an electrostatic charge dissipation layer formed on a surface of the film and electrically connected to the ground conductive trace. The electrostatic charge dissipation layer has an upper surface that serves as a contact surface for a detecting a contact work-piece.

13 Claims, 2 Drawing Sheets

CONTACT SENSOR PACKAGE STRUCTURE

BACKGROUND OF THE INVENTION

1. Field of the Invention

The present invention relates to a contact sensor package structure.

2. Description of the Related Art

Contact sensor package structure has been widely adopted in many types of electronic devices including, for example, computer screens, mouse and finger pattern identifiers. Due to the need for high sensitivity and miniaturization, most contact sensor packages have precise and miniature sensors and circuits. However, the precision and the minuteness of an electronic device often render the device more vulnerable to damage as a result of external environmental influence (such as pollutants). Thus, most contact sensor packages include an insulating but flexible film to serve as a contact surface so that the circuits and sensors within the packages are not directly exposed to the external environmental conditions. Yet, the frequent contact or friction of the insulating film with users or objects often produces static electricity. When electrostatic charges accumulates on the film up to a sufficient level, it possibly occurs that an electrostatic charges discharge through the internal circuits or sensors, leading to the irreversible damages to either the internal circuit or the sensors. In other words, more precise and compact electronic devices are more sensitive to electrostatic discharging. Hence, a method capable of reducing possible damage to contact sensor package due to electrostatic discharge is urgently required.

SUMMARY OF THE INVENTION

Accordingly, at least one objective of the present invention is to provide a contact sensor package structure having an insulating material surface that can dissipate static charges and improve electrostatic discharge problem.

To achieve these and other advantages and in accordance with the purpose of the invention, as embodied and broadly described herein, the invention provides a contact sensor package. The contact sensor package mainly comprises a substrate, a film, a sealant and a plurality of contact sensors disposed on the substrate. The substrate, the film and the sealant together define an enclosed space such that the contact sensors are disposed on the substrate within the enclosed space. The film has a surface, such as an upper surface or a lower surface, that serves as a contact surface for a detecting a contact work-piece. The contact sensor package of the present invention further comprises at least a ground conductive trace on the substrate and an electrostatic charge dissipation layer fabricated from a conductive material (for example, indium-tin-oxide compound) on the upper surface of the film. The upper surface of the electrostatic charge dissipation layer serves as a contact surface for detecting a contact work-piece. The electrostatic charge dissipation layer is electrically connected to the ground conductive trace on the substrate so that any static charges on the contact sensor package resulting from contact or friction can be channeled to the ground conductive trace. Hence, the contact sensor package is protected from irreversible damages to the sensors and circuits inside the package caused by possible electrostatic discharge.

In addition, the electrostatic discharge dissipation layer preferably covers the entire upper surface of the film so that static electricity on any section of the contact surface can be channeled away. Furthermore, the combined thickness of the film and the electrostatic discharge dissipation layer is preferably smaller than 12 μm to provide the contact sensor package with sufficient contact sensitivity.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
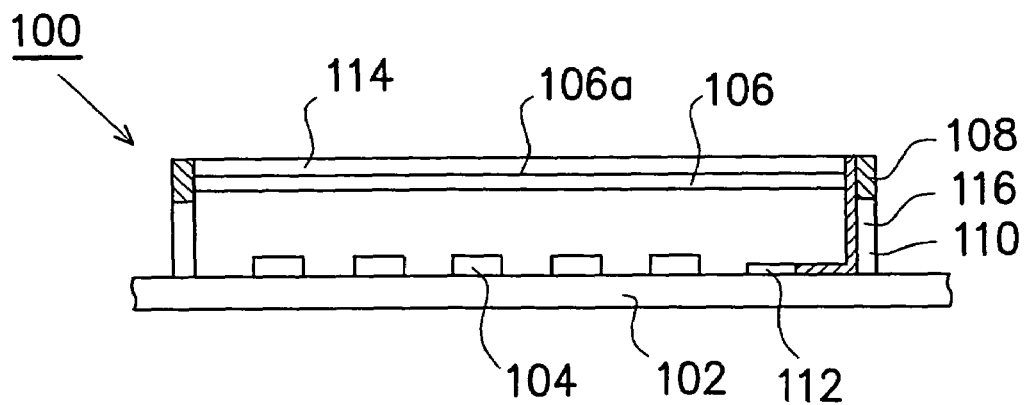
FIG. 1 is a schematic cross-sectional view of a contact sensor package according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a contact sensor package according to one embodiment of the present invention. As shown in FIG. 1, the contact sensor package 100 mainly comprises a substrate 102, a plurality of contact sensors 104 disposed on the substrate 102 and a film 106 disposed over the substrate 102 through a sealant 108. To prevent any contamination through environmental pollutants, the contact sensors 104 are enclosed within the sealed space defined by the substrate 102, the film 106 and the sealant 108.

The substrate 102 preferably has a plate structure formed from a hard material such as ceramic or glass. In the present embodiment, the contact sensor package 100 has a supporting element 110 erected on the substrate 102 surrounding the contact sensors 104. The film 106 is sealed to the top of the supporting element 110. Aside from the contact sensors 104, a plurality of conductive traces (not shown) and at least a ground conductive trace 112 are also formed on the substrate 102. Additionally, a chip (not shown) is also formed on the substrate 102 outside of the supporting element 100, with electric coupling to the contact sensors 104 via the conductive traces for at least processing the signals being generated by touch and any other necessary operation.

The film 106 serves two main purposes. The film 106 protects the sensors 104 and circuits inside the package 100 and provides an inert interface for transferring the contact with a work-piece into signals in the sensors 104 without other undesirable effects (such as short-circuiting neighboring sensors 104). Therefore, the film is preferably fabricated using an insulating but flexible material, for example, the Mylar series produced by Dupont.

An electrostatic charge dissipation layer 114 is disposed on the upper surface 106a of the film 106. Furthermore, the upper surface 106a of the electrostatic charge dissipation layer 114 also serves as a contact surface for detecting a work-piece (for example, a user's finger). The electrostatic charge dissipation layer 114 is fabricated using a conductive material (for example, indium-tin-oxide compound) and is electrically connected to the ground conductive trace 112 on the substrate 102 through a conductive material 116 (for example, a conductive glue). When a non-conductive work-piece contacts or brushes against the contact surface of the package 100, static charges or the so-called triboelectricity are often generated.

In the present embodiment, any static charge due to friction with the contact surface of the package 100 is channeled to the ground conductive trace 112 through the electrostatic charge dissipation layer 114 instead of going through the sensors 104 or internal circuits to cause damages. Preferably, the electrostatic charge dissipation layer 114 has a resistance not exceeding 60 ohm-meter so that static charges on the upper surface 106a of the film 106 can be channeled to the ground conductive trace 112 faster. Furthermore, to facilitate the dissipation of electric charges from anywhere on the upper surface 106a of the film 106, the electrostatic charge dissipation layer 114 preferably covers the entire top surface 106a of the film 106. In addition, the sensitivity of the contact sensor package 100 is inversely proportional to the combined thickness of the film 106 and the electrostatic charge dissipation layer 114. Hence, to provide the package 100 with sufficient contact sensitivity, the combined thickness of the film 106 and the electrostatic charge dissipation layer 14 is preferably smaller than 12 μm.

As shown in FIG. 1, the ground conductive trace 112 is disposed within the space defined by the substrate 102, the film 106, the supporting element 110 and the sealant 108. Hence, the conductive material 116 is free to run within the confine of the sealed space for electrically connecting the electrostatic charge dissipation layer 114 and the ground conductive trace 112 together.

Figure 2:
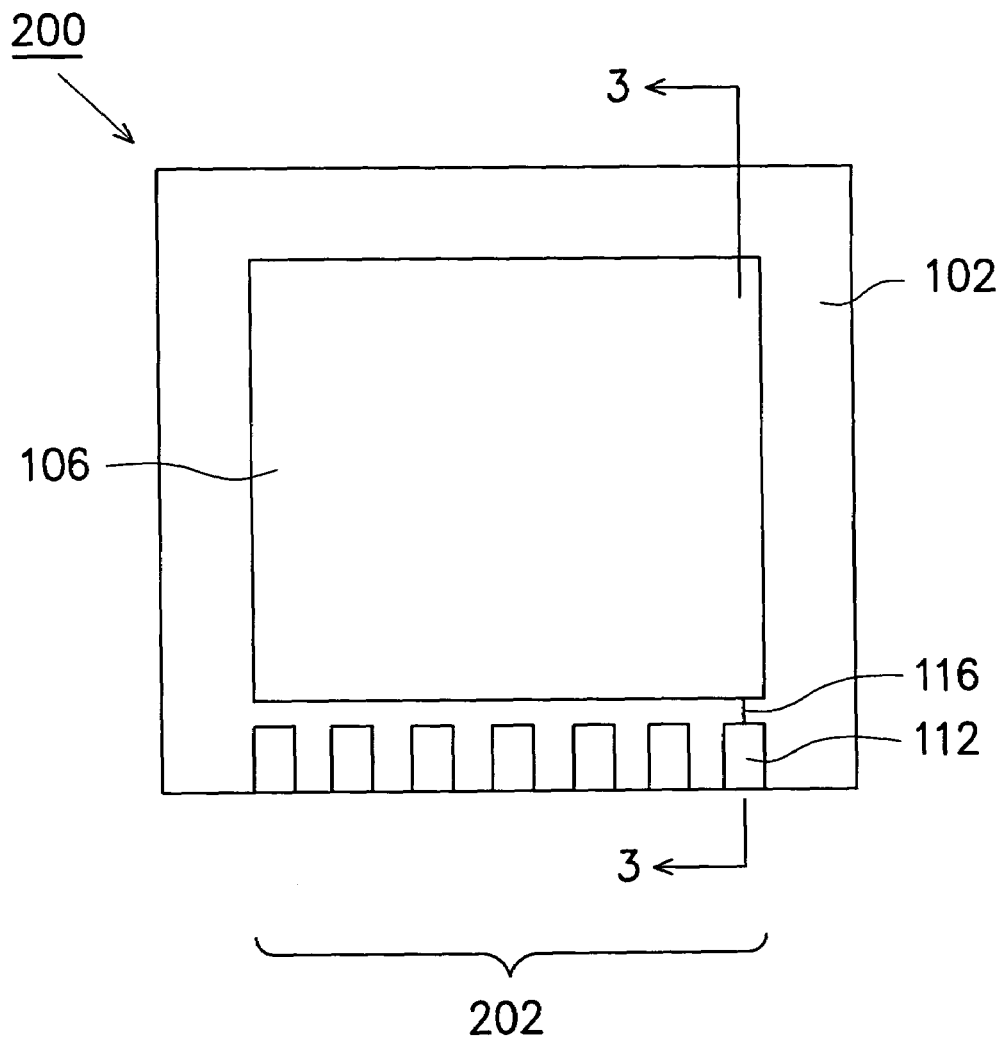
FIG. 2 is a top view of a contact sensor package according to another embodiment of the present invention.
Figure 3:
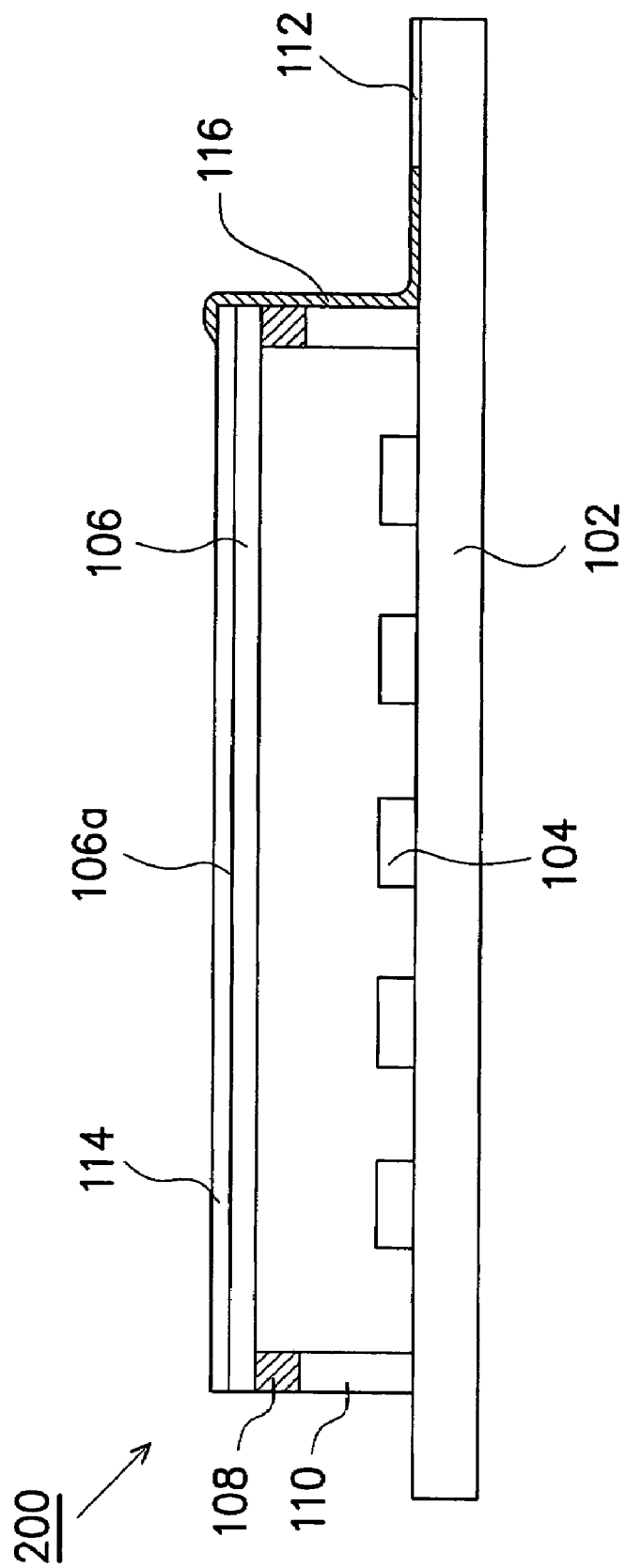
FIG. 3 is a cross-sectional view alone line 3—3 of the contact sensor package shown in FIG. 2.

According to another embodiment as shown in FIGS. 2 and 3, the ground conductive trace 112 can be disposed outside the contact sensor package 200, for example, as a finger on the substrate 102. In this case, the conductive material 116 may run outside the sealed space to connect the electrostatic charge dissipation layer 114 with the conductive ground trace 112.

In the contact sensor package of the present invention, an electrostatic charge dissipation layer formed on the film and electrically connected to a ground conductive trace on the substrate serves as a contact surface. Hence, any build-up of electric charges due to contact or friction with the contact sensor package is readily channeled away from the electrostatic charge dissipation layer instead of coursing through the sensors and internal circuit to cause possibly irreversible damages.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A contact sensor package structure, comprising:
   a substrate;
   a film disposed over the substrate;
   a sealant for stationing the film on the substrate, wherein the substrate, the film and the sealant together define an enclosed space;
   a plurality of contact sensors disposed on the substrate within the enclosed space;
   at least a ground conductive trace disposed on the substrate; and
   an electrostatic charge dissipation layer formed on a surface of the film and electrically connected to the ground conductive trace, wherein an upper surface of the electrostatic charge dissipation layer serves as a contact surface for detecting contact with a work-piece.

2. The contact sensor package structure of claim 1, wherein a material constituting the electrostatic charge dissipation layer comprises indium-tin-oxide (ITO) compound.

3. The contact sensor package structure of claim 1, wherein a combined thickness of the electrostatic charge dissipation layer and the film does not exceed 12 μm.

4. The contact sensor package structure of claim 1, wherein the substrate further comprises a supporting element erected on the substrate surrounding the contact sensors such that the sealant is on top of the supporting element and the film is sealed over the top of the supporting element via the sealant.

5. The contact sensor package structure of claim 4, further comprising a chip on the substrate located outside of the supporting element.

6. The contact sensor package structure of claim 1, wherein the electrostatic charge dissipation layer entirely covers the surface of the film.

7. The contact sensor package structure of claim 1, wherein the electrostatic charge dissipation layer and the ground conductive trace are electrically connected by a conductive glue.

8. The contact sensor package structure of claim 1, wherein the package further comprises a conductive material for electrically connecting the electrostatic charge dissipation layer with the ground conductive trace such that the conductive ground trace and the conductive material are both disposed outside the enclosed space.

9. The contact sensor package structure of claim 1, wherein the package structure further comprises a conductive material for electrically connecting the electrostatic charge dissipation layer with the ground conductive trace such that the conductive ground trace and the conductive material are both disposed inside the enclosed space.

10. The contact sensor package structure of claim 1, wherein the substrate is a glass substrate.

11. The contact sensor package structure of claim 1, wherein the supporting element is an adhesive body.

12. The contact sensor package structure of claim 1, wherein the supporting element is in a ring structure.

13. The contact sensor package structure of claim 1, wherein the electrostatic charge dissipation layer is disposed on an upper surface of the film.

* * * * *